United States Patent
Bae

(10) Patent No.: US 12,235,623 B2
(45) Date of Patent: Feb. 25, 2025

(54) 3D PRINTING METHOD, AND DEVICE FOR PERFORMING SAME ON THE BASIS OF A MATERIAL CHARACTERISTIC REQUIREMENT

(71) Applicant: Young Sik Bae, Seoul (KR)

(72) Inventor: Young Sik Bae, Seoul (KR)

(73) Assignee: WHOBORN INC., Seoul (KR)

( * ) Notice: Subject to any disclaimer, the term of this patent is extended or adjusted under 35 U.S.C. 154(b) by 618 days.

(21) Appl. No.: 17/296,014

(22) PCT Filed: Nov. 22, 2019

(86) PCT No.: PCT/KR2019/016070
§ 371 (c)(1),
(2) Date: May 21, 2021

(87) PCT Pub. No.: WO2020/106090
PCT Pub. Date: May 28, 2020

(65) Prior Publication Data
US 2022/0011745 A1     Jan. 13, 2022

(30) Foreign Application Priority Data

| Nov. 23, 2018 | (KR) | ........................ | 10-2018-0146736 |
| Dec. 26, 2018 | (KR) | ........................ | 10-2018-0169249 |
| May 16, 2019 | (KR) | ........................ | 10-2019-0057511 |
| Nov. 15, 2019 | (KR) | ........................ | 10-2019-0146750 |

(51) Int. Cl.
*G05B 19/4099* (2006.01)
*B29C 64/386* (2017.01)
*B33Y 50/00* (2015.01)
*B29L 31/34* (2006.01)
*B33Y 80/00* (2015.01)

(52) U.S. Cl.
CPC ........ *G05B 19/4099* (2013.01); *B29C 64/386* (2017.08); *B33Y 50/00* (2014.12); *B29L 2031/3406* (2013.01); *B33Y 80/00* (2014.12); *G05B 2219/35134* (2013.01); *G05B 2219/49023* (2013.01)

(58) Field of Classification Search
CPC .................................................. G05B 19/4099
See application file for complete search history.

(56) References Cited

U.S. PATENT DOCUMENTS

| 2007/0188485 A1* | 8/2007 | Yasukawa | ............. G06F 3/1234 345/419 |
| 2015/0066440 A1* | 3/2015 | Chen | ....................... G06T 17/00 703/1 |
| 2015/0261888 A1* | 9/2015 | LeTourneau | ............ G06F 30/00 703/1 |

(Continued)

*Primary Examiner* — Suresh Suryawanshi
(74) *Attorney, Agent, or Firm* — Columbia IP Law

(57) ABSTRACT

A 3D printing method and a device for performing same are disclosed. In some examples, a 3D printing output method according to may include generating raw material data for at least one raw material to be used for printing a 3D object on the basis of a raw material characteristic requirement; designing the 3D object. The 3D printing method and a device may include performing a simulation on the 3D object designed on the basis of the raw material data and generating the 3D printing data for performing 3D printing on the 3D object on the basis of an evaluation criterion and the result of the simulation.

10 Claims, 16 Drawing Sheets

(56) References Cited

U.S. PATENT DOCUMENTS

| | | | |
|---|---|---|---|
| 2016/0093100 A1* | 3/2016 | Ju | G05B 19/4099 |
| | | | 700/98 |
| 2017/0129185 A1* | 5/2017 | Buller | B23K 26/702 |
| 2019/0047223 A1* | 2/2019 | Kurosawa | B33Y 30/00 |
| 2019/0271967 A1* | 9/2019 | Radjou | G09B 23/285 |
| 2020/0156323 A1* | 5/2020 | Woytowitz | B33Y 50/02 |

* cited by examiner

FIG. 2

| NO. | Technical Title | Method | Detail |
|---|---|---|---|
| 1 | Material-Simulation | PLA, ABS, Metal, Carbon, Silicon, Ceramic, Bio Material ... | Characteristic information analysis for each material |
| 2 | Material Convergence -Simulation | PLA+Metal, ABS+Metal, PLA+Carbon, ABS+Carbon, PLA+Silicon, ABS+Silicon, ... | Performing simulation on combination characteristic of materials |
| 3 | Physics-Simulation | Hardness, Weight, Tensile strength, Elasticity ... | Performing simulation on physical characteristic of material |
| 4 | Electric-Simulation | PLA Metal, ABS+Metal, PLA+Carbon, ABS+Carbon ... | Performing simulation when materials are bonded characteristic |
| 5 | 3D Schematic-Simulation | 2D Schematic | Analyzing 2D circuit diagram and converting 2D circuit diagram into 3D model by performing operation such as 3D artwork |
| 6 | Material Convergence Slicing | PLA, ABS, Metal, Carbon, Silicon, Ceramic, Bio Material, PLA+Metal, ABS+Metal, PLA+Carbon, ABS+Carbon, PLA+Silicon, ABS+Silicon, ... | Performing slicing for multi-material to generate tool path of 3D printer |
| 7 | Bio-Simulation | Crystal structure, catalyst property structure, harmfulness to human bod, etc. | Performing simulation on bio-characteristic of material |

FIG. 5
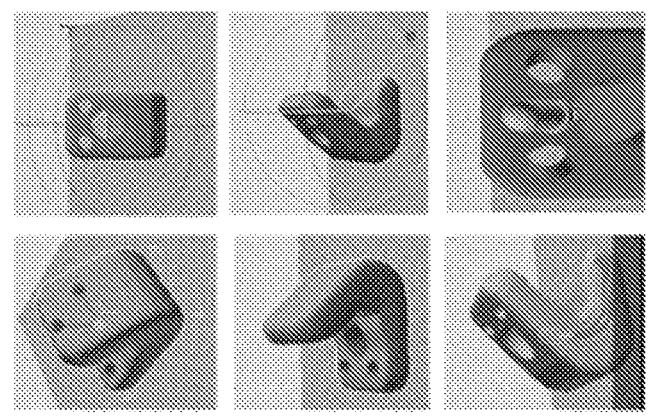
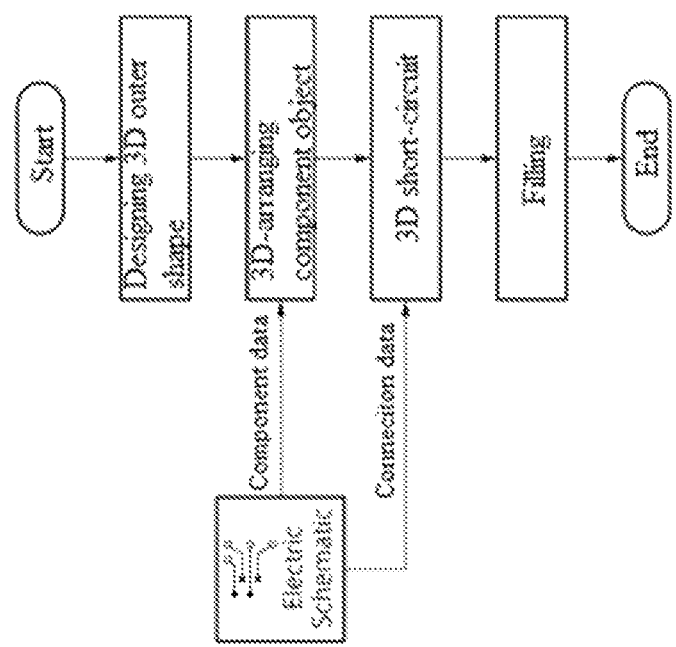

3D PRINTING METHOD, AND DEVICE FOR PERFORMING SAME ON THE BASIS OF A MATERIAL CHARACTERISTIC REQUIREMENT

RELATED APPLICATION

This application claims benefit of priority to Korean Patent Application Serial Number 10-2018-0146736, filed on Nov. 23, 2018, Korean Patent Application Serial Number 10-2018-0169249, filed on Dec. 26, 2018, Korean Patent Application Serial Number 10-2019-0057511, filed May 16, 2019, and Korean Patent Application 10-2019-0146750, filed on Nov. 15, 2019, which are all incorporated herein by reference in their entirety for all purposes.

INFORMATION

Unless otherwise indicated herein, the approaches described in this section are not prior art to the claims in this application and are not admitted to be prior art by inclusion in this section.

In general, a 3D printer is developed to manufacture a prototype before a product is released. The 3D printer has an advantage in that the 3D printer may produce a prototype that is substantially the same as a real product and check a problem of the real product while saving costs and time.

The 3D printer converts a 3D shape that is modeled through software such as CAD system into slice data obtained by dividing the 3D shape into a plurality of thin cross-sectional layers, then sculpts plate-type sheets using the plurality of thin cross-sectional layers, and then laminates the plate-type sheets to complete a sculpture.

As a 3D printing technology is developed, a further complicate product may be produced, and the 3D printing technology may be applied to various products. The above-described 3D printer manufactures a product in various methods. The 3D printer has various product production methods such as photopolymerization, powder bed fusion, material jetting, and material extrusion.

The 3D printer manufactures a product in various methods. Even a vehicle may be manufactured through the 3D printer technology.

Although an eco-friendly hybrid vehicle using an electric motor is currently a general trend, an electric vehicle market is expected to grow annually because of perception change on traffic accidents, life quality improvement, and rapid transformation into an aging society.

Since an electric vehicle uses a motor in common, the electric vehicle essentially includes a battery for storing electricity, a battery management system (BMS), an inverter for generating AC for driving a motor, a converter for converting AC to low voltage DC for vehicle electric units, and a vehicle controller for controlling an entire vehicle system. Electricity with a high voltage of 100V to 300V is necessary for driving a large-sized motor, and to this end, a special cable or connector and control are required.

Since more electronic device components such as a sensor, a camera, and a display are used in the electric vehicle, complicated line connections are inevitable, and thus safety action is required. Due to safety Issues related to electrical control problems such as battery discharge and fire during long distance driving, when electricity is blocked, safety action on control problems such as brakes operated by electricity is required.

The 3D printer technology may be used for safety problems of the electric vehicles or the like.

All subject matter discussed in this section of this document is not necessarily prior art and may not be presumed to be prior art simply because it is presented in this section. Plus, any reference to any prior art in this description is not and should not be taken as an acknowledgement or any form of suggestion that such prior art forms parts of the common general knowledge in any art in any country. Along these lines, any recognition of problems in the prior art are discussed in this section or associated with such subject matter should not be treated as prior art, unless expressly stated to be prior art. Rather, the discussion of any subject matter in this section should be treated as part of the approach taken towards the particular problem by the inventor(s). This approach in and of itself may also be inventive. Accordingly, the foregoing summary is illustrative only and not intended to be in any way limiting. In addition to the illustrative examples, embodiments, and features described above, further examples, embodiments, and features will become apparent by reference to the drawings and the following detailed description.

SUMMARY

The present disclosure provides examples of 3D printing output methods. Some example methods include generating material data for at least one material to be used for printing a 3D object on the basis of a material characteristic requirement. Example methods include designing the 3D object and performing a simulation on the 3D object designed on the basis of the material data. Example methods include generating the 3D printing data for performing 3D printing on the 3D object on the basis of an evaluation criterion and a result of the simulation.

The foregoing summary is illustrative only and not intended to be in any way limiting. In addition to the illustrative examples, embodiments, and features described above, further examples, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings:

FIG. 2 is a view representing a technical architecture of the 3D printing method.

FIG. 5 is a view representing one example for explaining operations of a 3D designer.

DETAILED DESCRIPTION

Figure 1:
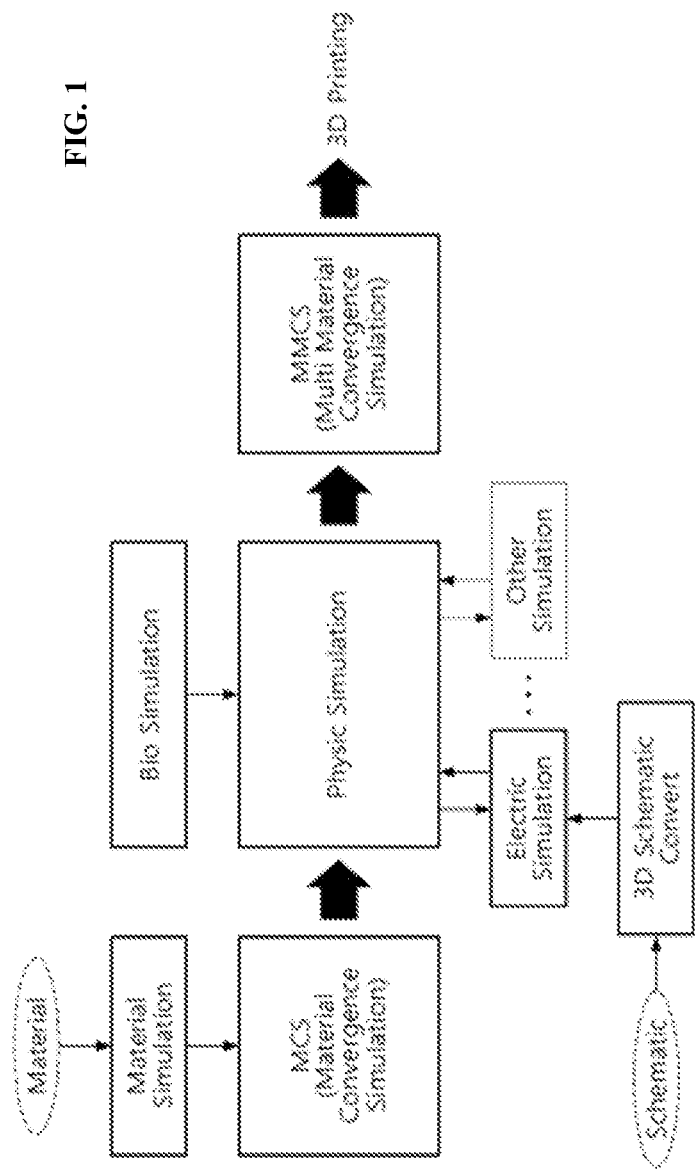
FIG. 1 is a view for explaining a concept of a 3D printing method for outputting various materials according to an embodiment.

Hereinafter, embodiments will be described with reference to the accompanying drawings. However, it should be apparent to those having ordinary skill in the art that various changes, modifications, or alterations to the invention as described herein may be made, none of which changes the scope of claims of the present invention. In addition, the principle, viewpoint, and embodiments of the present invention and all detailed descriptions of specific embodiments should be understood to be intended to include the structural and functional equivalents of the matter.

In the following description, the technical terms are used only for explain a specific exemplary embodiment while not limiting the present invention. The terms of a singular form may include plural forms unless referred to the contrary. The meaning of 'include' or 'comprise' specifies a property, a fixed number, a method, an operation, an element, a component, or a combination thereof but does not exclude other properties, fixed numbers, methods, operations, elements, components, combinations thereof.

It will be understood that although the terms of first and second are used herein to describe various elements, these elements should not be limited by these terms. These terms are used only to differentiate one component from another one. For example, without departing from the scope of the present invention, a first element could be termed a second element, and similarly a second element could be termed a first element.

Unless terms used in the present disclosure are defined differently, the terms may be construed as meaning known to those skilled in the art. Terms such as terms that are generally used and have been in dictionaries should be construed as having meanings matched with contextual meanings in the art. In this description, unless defined clearly, terms are not ideally, excessively construed as formal meanings.

In descriptions with reference to the accompanying drawings, the same reference numeral will be given to the same component regardless of reference symbols, and thus, its duplicated description will be omitted. Moreover, detailed descriptions related to well-known functions or configurations will be ruled out in order not to unnecessarily obscure subject matters of the present invention.

This disclosure is drawn, inter alia, to methods and devices related to 3D printing. The methods and devices may include outputting a convergence material. Additionally, the methods and devices may include mounting at least one component object into a 3D object while forming the 3D object. Further, the methods and devices may include a 3D printing technology capable of effectively forming an electric wire on an object.

In some examples, a 3D printing output method may include generating material data for at least one material to be used for printing a 3D object on the basis of a material characteristic requirement. The example method may include designing the 3D object, performing a simulation on the 3D object designed on the basis of the material data, and generating the 3D printing data for performing 3D printing on the 3D object on the basis of an evaluation criterion and a result of the simulation.

In one example, the method of generating the material data may include performing a material simulation for determining one kind of material or different kinds of materials and performing a material convergence simulation for determining a convergence material.

In another example, the method of performing the material simulation may include performing a simulation on a plurality of materials included in a material list on the basis of the material characteristic requirement and selecting at least one material among the plurality of materials on the basis of a result of the simulation.

In another example, the method of performing the material convergence simulation may include performing a simulation on a plurality of convergence materials included in a convergence material list on the basis of a convergence method and convergence material basic data and selecting at least one convergence material among the plurality of convergence materials on the basis of a result of the simulation.

In another example, the method of performing the simulation on the plurality of convergence materials may include estimating a suitable convergence ratio of the plurality of convergence materials and checking information on material characteristics of the convergence materials that are converged according to the suitable convergence ratio estimated for each convergence material.

In some examples, the method of designing the 3D object may include designing a 3D outer shape based on 3D modeling data of the 3D object and obtaining component data of a component object and connection data of a connection relationship between the component objects by analyzing an electric schematic through a 3D schematic convert method. The example method may include arranging the component objects into the 3D outer shape on the basis of the component data and designing a connection part between the component objects disposed in the 3D outer shape on the basis of the connection data.

In another example, the method of designing the 3D object may further include allocating a material to each area of the 3D object on the basis of the material data. Additionally, the example method of allocating may include filling a space in the 3D outer shape except for the component object and the connection part with a specific material.

In another example, the method of performing the simulation may include performing a simulation on an electric characteristic of the designed 3D object; performing a simulation on a physical characteristic of the designed 3D object; and performing a simulation on a bio-characteristic of the designed 3D object. Additionally, in another example, the method of performing the simulation may include calculating an optimized output path for performing 3D printing on the designed 3D object.

In another example, the method of generating the 3D printing data may include feeding-back a report of the simulation when the result of the simulation is not satisfied with the evaluation criterion or generating the 3D printing data on the basis of the report of the simulation when the result of the simulation satisfies the evaluation criterion.

In some examples, a 3D printing output method may include generating 3D printing data on the basis of 3D modeling data of a 3D object, object information of a component object, and a connection relationship of the component object. The example of the 3D printing method may include mounting the component object into the 3D object while forming the 3D object on the basis of the 3D printing data.

In one example, the method of generating may include determining an area in which the component object is to be disposed among a plurality of areas configuring the 3D object on the basis of the 3D modeling data, the object information, and the connection relationship. Additionally, the method of generating may include determining a unit structure to be formed in the area in which the component object is to be disposed, calculating a mounted position of the component object, and calculating an insertion time of the component object. In some examples, the 3D printing data may include information on the area in which the component object is to be disposed, the unit structure, the mounted position, and the insertion time.

In one example, the method of generating may further include a correcting at least one of the mounted position and the unit structure.

In one example, the method of correcting may include correcting only a lattice in which the component object is to be disposed so that the component object is inserted and fixed to the lattice in which the component object is to be disposed.

In one example, the method of determining the area in which the component object is to be disposed may include allocating a material of the area in which the component object is to be disposed on the basis of at least one of a material, a shape, an electric property of the component object, and a component role in the 3D object.

In one example, the material of the area in which the component object is to be disposed may be allocated differently from a material of the component object.

In one example, the determining the unit structure may include determining the unit structure on the basis of object information of the component object.

In one example, the unit structure may be determined as a unit structure including a unit lattice corresponding to a size of the component object.

In one example, the unit structure may be determined as a unit structure including a unit lattice corresponding to a size of the component object having a minimum size among the component objects.

In one example, the method of calculating the mounted position may include setting a coordinate system on the basis of a central point of the 3D object and a central point of the unit structure and calculating the mounted position by using the coordinate system.

In one example, the coordinate system may set a vertical direction of a plane of the 3D object as a Z-axis with respect to a center of gravity of the 3D object.

In one example, the 3D printing output method may further include bonding a bottom surface of the component object and a top surface of the unit structure so that the component object is fixed to a position at which the component object is disposed on the unit structure.

In another example, the 3D printing output method may further include inserting the component object to the lattice so that the component object is fixed by the lattice of the unit structure and bonding the component object along a boundary at which the component object is inserted to and contact the lattice.

In one example, the method of mounting may include forming at least one of the 3D object and the component object while selectively performing a one-kind of material output method, a different kinds of materials output method, and a convergence material output method.

In some examples, a 3D printing method may include determining a wire area in an object and outputting a wire unit to the wire area.

In one example, the method of determining may include determining the wire area on the basis of a scan image of the object and an installation position of a component of the object.

In one example, the 3D printing method may further include generating a scan image of the object.

In one example, the method of outputting may include outputting the wire unit by using a convergence multi-material.

In one example, the wire unit may include a wire part for allowing electricity to flow therethrough and a protection separation part for protecting the wire part from an area of a frame corresponding to the wire area.

Additionally, in another example, the wire part may further include an outer part for surrounding the protection separation part and coupled to the frame corresponding to the wire area.

In one example, the wire part may be outputted by using a conductive material, the protection separation part may be outputted by using a non-conductive material, and the outer part may be outputted by using a carbon material.

A 3D printing method according to an embodiment will be described with reference to FIGS. 1 to 6.

FIG. 1 is a view for explaining a concept of the 3D printing method for outputting various materials according to an embodiment, and FIG. 2 is a view showing a technical architecture of the 3D printing method.

A 3D object may be formed through the 3D printing method. The 3D object may include a 3D outer shape, at least one component object, and a connection part for connecting the component objects.

The 3D printing method may perform various simulations and generate 3D printing data for performing 3D printing on the 3D object through the simulations in order to output the 3D object through the 3D printing.

For example, the simulations may include a material-simulation method, a material convergence-simulation method, a 3D schematic convert method, a physics-simulation method, an electric-simulation method, a bio-simulation method, and other simulation methods, and a multi-material convergence simulation method or a multi material convergence slicing simulation method.

The material-simulation method is used to analyze characteristic information for each material. The material-simulation method may be applied to analyze characteristics of a non-conductive material such as ABS and PLA, which is not electrically conductive, a conductive material such as metal and carbon, which is electrically conductive, and a bio-material such as teeth, joints, and cells. The material-simulation method is performed to determine whether one kind of material or different kinds of materials.

The material convergence-simulation method is used to simulate a combination characteristic of materials. The material convergence-simulation method may reproduce a phenomenon caused by a scientific (physics, chemistry, biology, etc.) material combination. The material convergence-simulation method is performed to determine a convergence material.

The 3D schematic convert method may be configured to analyze a design drawing, a structure drawing, an electric schematic, and the like to perform a 3D output. Each of the design drawing, the structure drawing, and the electric schematic may be a 2d schematic (e.g., realized by various cad files) or a 3D schematic (e.g., realized by 3D functional convert). The 3D schematic convert method may read data such as bio and chemical structures in addition to the electric schematic to perform a 3D conversion (like 3D schematic convert).

The physics-simulation method (or mechanical-simulation method) is used to simulate a physical characteristic of a material. The physics-simulation method may calculate a weight (or a center of gravity), a tensile strength, elasticity and hardness, an electromagnetic phenomenon, an optical phenomenon, and the like on the basis of electricity, magnetism, electromagnetism, optics, a movement, energy, a mass, a temperature, a velocity, or the like of the physics.

The electric-simulation method is used to simulate an electric characteristic when materials are bonded. The electric-simulation method may verify an electric characteristic when a conductive material and a non-conductive material are used. Also, the electric-simulation method may perform a simulation according to function realization.

The bio-simulation method is used to simulate a bio-characteristic of a material. The bio-simulation method may perform a simulation on a crystal structure, a catalyst property structure, harmfulness to a human body, and a biological characteristic.

The multi material convergence simulation method may calculate an optimized output path in consideration of a characteristic for each material of a lamination output device (e.g., a 3D printer). Also, the multi material convergence simulation method may generate an output quality simulation for each material and output data capable of producing an optimized output through the physics-simulation method, the electric-simulation method, the bio-simulation method, or a characteristic simulation method.

The characteristic simulation method may include other simulation methods on various characteristics in addition to the physics-simulation method, the electric-simulation method, and the bio-simulation method. Also, the physics-simulation method may perform simulations by including simulation methods on a bio-characteristic, an electric characteristic, and various characteristics in addition to a physical (or mechanical) characteristic. The 3D printing method may generate 3D printing data by performing the above-described simulation methods and selectively perform a single material output, a different kinds of materials output, and a convergence material output.

Figure 3:
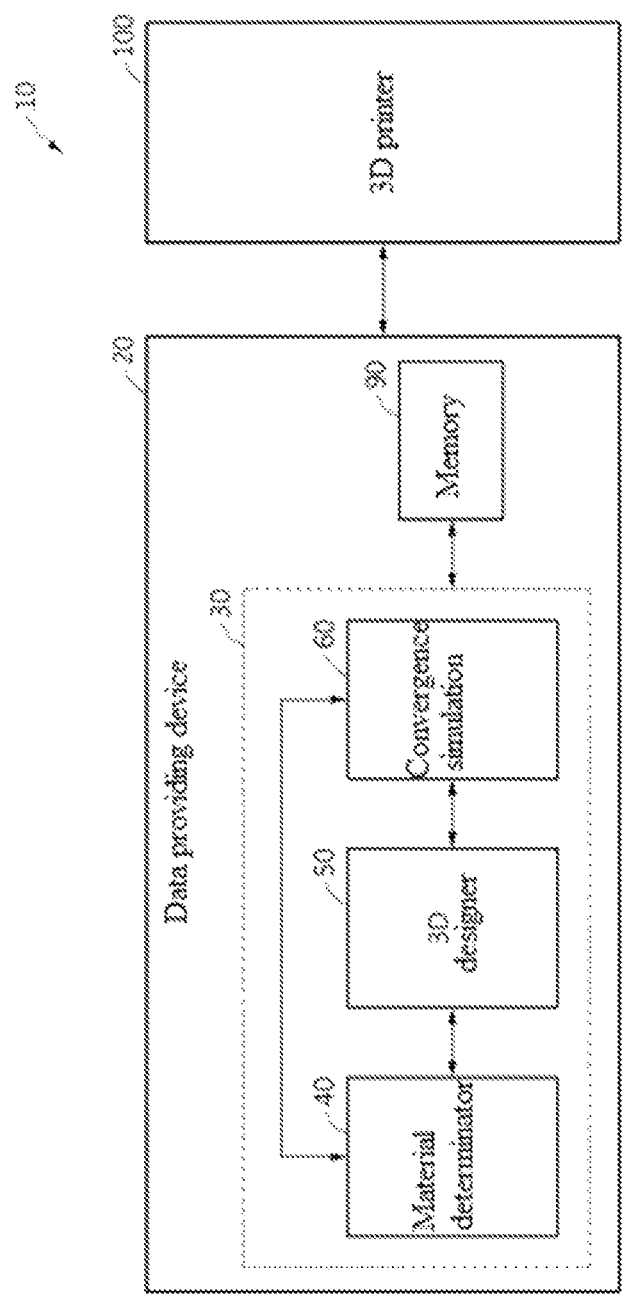
FIG. 3 is a schematic block diagram of a 3D printer system according to an embodiment.

FIG. 3 is a schematic block diagram of a 3D printer system according to an embodiment.

A 3D printer system 10 includes a data providing device 20 and a 3D printer 100. The data providing device 20 may be realized as a device independent from the 3D printer 100 and connected to the 3D printer 100 to communicate with the 3D printer 100 in various methods including local or remote connection. However, the embodiment of the present invention is not limited thereto. The data providing device 20 according to an embodiment may be realized in the 3D printer 100.

The data providing device 20 may perform various simulations and generate 3D printing data for performing 3D printing on the 3D object through the simulations in order to output the 3D object through 3D printing.

The data providing device 20 includes a controller 30 and a memory 90. The controller 30 may process data stored in the memory 90. The controller 30 may execute a computer readable code (e.g., software) stored in the memory 90 and an instruction induced by the controller 30.

The controller 30 may be a data processing device that is realized as hardware having a circuit having a physical structure for executing desired operations. For example, the desired operations may include codes or instructions included in a program.

For example, the data processing device realized as hardware may include a microprocessor, a central processing unit, a processor core, a multi-core processor, a multiprocessor, an application-specific integrated circuit (ASIC), and a field programmable gate array (FPGA).

The controller 30 may control overall operations of the data providing device 20. The controller 30 may include a material determinator 40, a 3D designer 50, and a convergence simulator 60.

The material determinator 40 may perform the material simulation method and the material convergence simulation method. Operations of the material determinator 40 will be described in detail in FIG. 4.

The 3D designer 50 may perform the 3D schematic convert method. Operations of the 3D designer 50 will be described in detail in FIG. 5.

The convergence simulator 60 may perform the physics-simulation method, the bio-simulation method, the electric-simulation method, and the multi-material convergence simulation method. Also, the convergence simulator 60 may perform simulation methods on various characteristics for a relationship (e.g., bonding, combining, convergence, etc.) between a material and/or a material, which are selected to form the 3D object, in addition to the physics-simulation method, the electric-simulation method, and the bio-simulation method. Operations of the convergence simulator 60 will be described in detail in FIG. 6.

The 3D printer 100 may receive 3D printing data transmitted from the data providing device 20. For example, the 3D printing data may include 3D modeling data, material data, component data, and connection data.

The 3D printer 100 may form the 3D object based on the 3D printing data. For example, the 3D printer 100 may form the 3D object and the component object while selecting a single material output method, a different kinds of materials output method, and a convergence material output method. Here, the 3D printer 100 may form the 3D object while mounting at least one component object into the 3D object.

Figure 4:
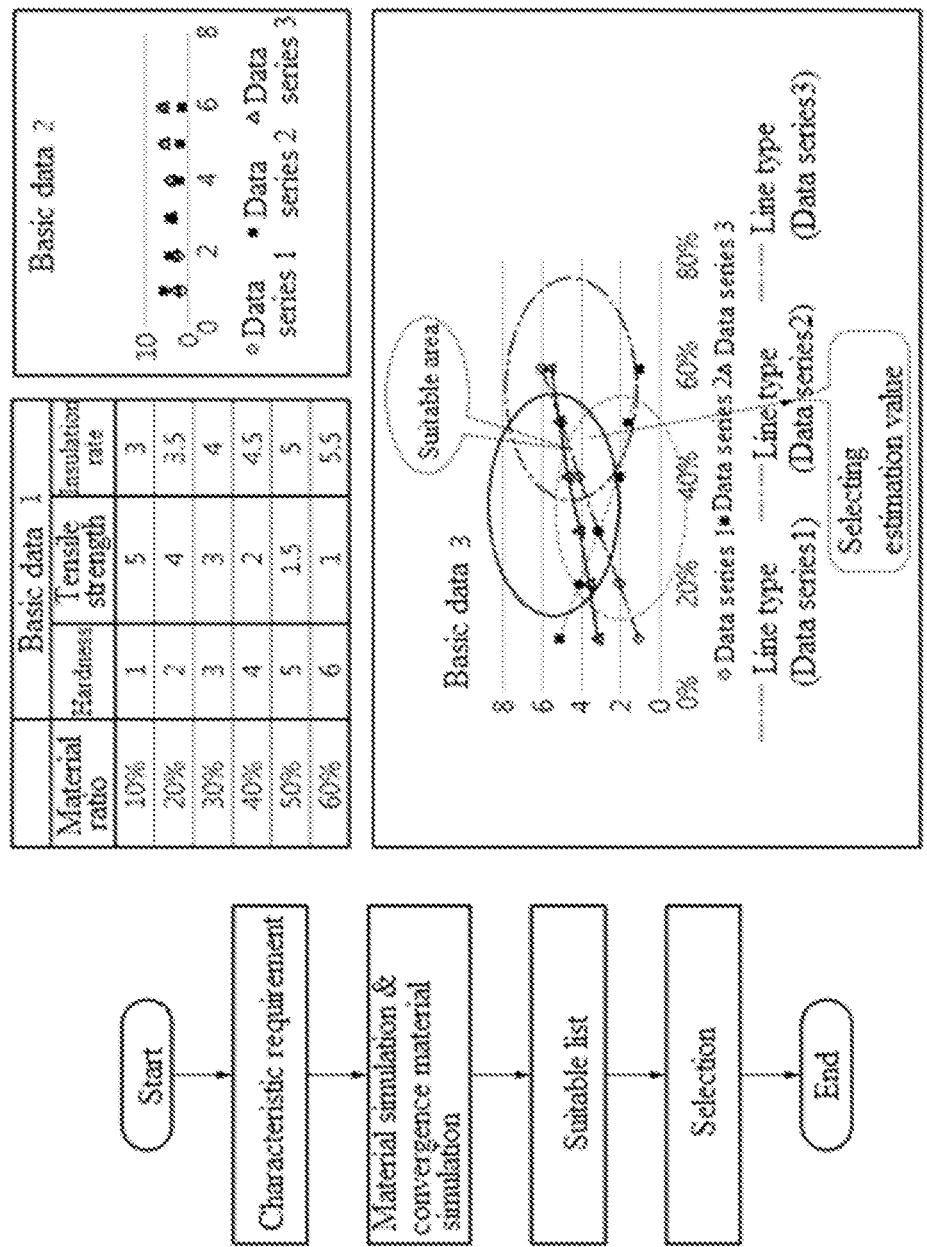
FIG. 4 is a view representing one example for explaining operations of a material determinator.

FIG. 4 is a view representing one example for explaining operations of the material determinator.

The material determinator 40 may perform the material simulation and the material convergence simulation to determine at least one material to be used for printing the 3D object. The at least one material may include at least one of one kind of material, different kinds of materials, and a convergence material.

The material determinator 40 may determine a material by performing at least one of the material simulation and the material convergence simulation.

The material simulation is performed to determine whether the one kind of material or the different kinds of materials.

The material determinator 40 may perform simulations of a plurality of materials included in a material list based on a material characteristic requirement that is set according to the 3D object to be 3D-printed. The material characteristic requirement is a value related to an electric characteristic (whether a conductor or a non-conductor) and a mechanical characteristic (or a physical characteristic, e.g., tensile strength, properties, impact resistance, etc.) of a material, representing a value required to a material to be printed as the 3D object.

The material determinator 40 may select at least one material among the plurality of materials based on simulation results. The selected material may have a characteristic corresponding to the material characteristic requirement. For example, the selected material may have a characteristic closest to the material characteristic requirement.

The material determinator 40 may determine the selected material as at least one material to be used for printing the 3D object.

The convergence material simulation is performed to determine a convergence material.

The material determinator 40 may perform simulations of a plurality of convergence materials included in a convergence material list based on a material characteristic requirement that is set according to the 3D object to be 3D-printed.

The material determinator 40 may estimate a suitable convergence ratio of the plurality of convergence materials based on the material characteristic requirement, a convergence method, and convergence pre-test data (e.g., convergence material basic data). Each convergence method may include information on a ratio, a temperature, and a time for converging materials to produce the convergence material. Like the basic data in FIG. 4, the convergence pre-test data may include information on the material characteristic of the convergence material produced according to the material convergence ratio.

The material determinator 40 may check information on the material characteristic of the convergence material that is converged according to the estimated suitable convergence ratio for each convergence material and select the convergence material corresponding to the material characteristic requirement. The selected convergence material may have a characteristic corresponding to the material characteristic requirement. For example, the selected convergence material may have a characteristic closest to the material characteristic requirement.

The material determinator 40 may determine the selected convergence material as at least one material to be used for printing the 3D object.

The material determinator 40 may determine a material by performing only the material simulation, performing only the convergence material simulation, or performing all of the material simulation and the convergence material simulation.

For example, when the material for printing the 3D object is not in the material list, or the convergence material is preferred to be used instead of using one kind of material, the material determinator 40 may select the convergence material by performing the convergence material simulation.

When all of the material simulation and the convergence material simulation are performed, the material determinator 40 may determine at least one of a material determined through the material simulation and a material determined through the convergence material simulation as at least one material to be used for printing the 3D object in consideration of required costs and time of the material.

The material determinator 40 may generate material data of the determined material. The material data may include information on the one kind of material, the different kinds of materials, and/or the convergence material. In case of the convergence material, the material data may further include information on a convergence method and a suitable convergence ratio.

FIG. 5 is a view representing one example for explaining operations of the 3D designer.

The 3D designer 50 may design the 3D object based on 3D the modeling data of the 3D object, the component data of the component object, and the connection data of connection between the component objects.

Firstly, the 3D designer 50 may design a 3D outer shape based on the 3D modeling data of the 3D object. Also, a user may design the 3D outer shape of the 3D object by oneself.

Thereafter, the 3D designer 50 may perform the 3D schematic convert method. The 3D schematic convert method may be configured to analyze an electric schematic to perform a 3D output. The electric schematic may be a 2d schematic (e.g., realized by various cad files) or a 3D schematic (e.g., realized by 3D functional convert).

The 3D designer 50 may read scientific data such as bio and chemical structures in addition to the electric schematic to perform a 3D conversion (like 3D schematic convert) suitable to the characteristic.

The 3D designer 50 may obtain the component data of the component objects configured to allow the 3D output and the connection data of the connection relationship between the component objects by analyzing the electric schematic through the 3D schematic convert method. The electric schematic may include component data and connection data.

The 3D designer 50 may use the component data to arrange the component object in the 3D outer shape and use the connection data to design the connection part between the component objects disposed in the 3D outer shape.

The 3D designer 50 may allocate a material to each area of the 3D object based on the material data. For example, the 3D designer 50 may allocate a space except for the component object and the connection part to fill a specific material therein. The specific material may be a non-conductor material.

The 3D designer 50 may perform the above-described process to design the 3D object in which the component object and the connection part are arranged.

Figure 6:
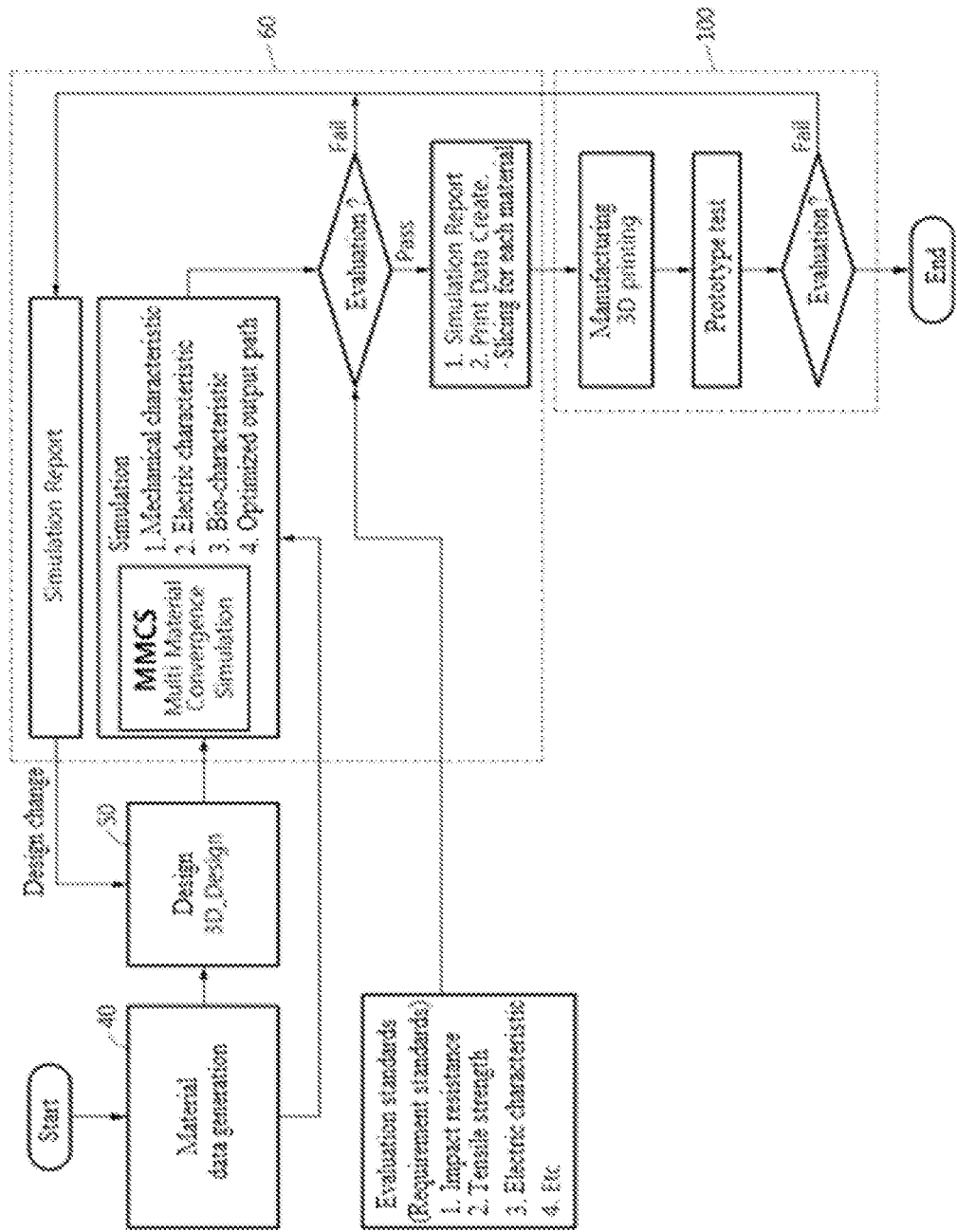
FIG. 6 is a view representing one example for explaining operations of a convergence simulator.

FIG. 6 is a view representing one example for explaining operations of the convergence simulator.

The convergence simulator 60 may calculate an optimized output path of the 3D object designed based on the material data, the component data, and the connection data. For example, the convergence simulator 60 may calculate the optimized output path in consideration of the characteristic for each material.

Also, the convergence simulator 60 may perform simulations on the 3D object designed based on the material data and an evaluation criterion. For example, the convergence simulator 60 may perform simulations on the electric characteristic, the physical characteristic (or mechanical characteristic), and/or the bio-characteristic of the designed 3D object. The evaluation criterion may represent a criterion value of each of the electric characteristic, the mechanical characteristic (e.g., an impact resistance, a tensile strength, etc.), and/or the bio-characteristic, which are required when the 3D object is printed. The convergence simulator 60 may perform simulation methods on various characteristics for a relationship (e.g., bonding, combining, convergence, etc.) between a material and/or a material, which are selected to form the 3D object, in addition to the physics-simulation method, the electric-simulation method, and the bio-simulation method.

The simulation on the electric characteristic of the designed 3D object may be performed based on the connection relationship between the components, i.e., the connection data and the material data. For example, the convergence simulator 60 may check a disconnection and a short-circuit between the connection parts based on a minimum distance between the connection part (e.g., a wire) and the connection part (e.g., a wire). For another example, the convergence simulator 60 may perform the simulation on the electric characteristic based on a cross-section, a length, an electric resistance, and a magnitude of a current of a specific connection part.

The simulation on the physical characteristic of the designed 3D object may be performed based on the component data and the material data. For example, the convergence simulator 60 may perform the simulation on the overall characteristics such as the tensile strength and the impact resistance of the 3D object designed based on a weight, an installation position, and a strength of the component object.

The simulation on the bio-characteristic of the designed 3D object may be performed based on the material data. For example, the convergence simulator 60 may perform the simulation on the bio-characteristic of the 3D object designed based on a position at which the 3D object is to be disposed and information of constituents of the material.

Since the characteristic of the material allocated to each area of the designed 3D object affects the characteristic of the designed 3D, the material data is necessary when the simulation on the electric characteristic, the physical characteristic, and/or the bio-characteristic of the designed 3D object is performed.

The convergence simulator 60 may compare the simulation result with the evaluation criterion and generate a simulation report of the simulation result.

When the simulation result does not satisfy the evaluation criterion, the convergence simulator 60 may feed-back the simulation report to the material determinator 30 and the 3D designer 50. The material determinator 30 and the 3D designer 50 may re-perform the simulation based on the simulation report, and the convergence simulator 60 may re-perform the simulation by using a re-performed result (the material data and the designed 3D object (the 3D modeling data, the component data, and the connection data)).

When the simulation result satisfies the evaluation criterion, the convergence simulator 60 may generate the 3D printing data for performing 3D printing on the 3D object based on the simulation report. The 3D printing data may include the material data, the 3D modeling data, the component data, and the connection data. Here, the 3D printing data may be generated by being sliced for each material.

The 3D printing data may be outputted to the 3D printer 100 and used for a pilot production test through the 3D printer 100. When the pilot production test shows a poor result, the simulation report generated in the 3D printer 100 is fed back to the material determinator 30 and the 3D designer 50. The material determinator 30 and the 3D designer 50 may re-perform the simulation based on the fed-back simulation report, and the convergence simulator 60 may re-perform the simulation by using a re-performed result (the material data and the designed 3D object (the 3D modeling data, the component data, and the connection data)).

The material determinator 30, the 3D designer 50, and the convergence simulator 60 may repeatedly perform the simulation processes described in FIGS. 3 to 5 until the simulation result is satisfied by using the fed-back simulation report (e.g., the designed 3D object satisfies the electric characteristic, the mechanical characteristic, and/or the bio-characteristic).

As described above, the 3D printing method according to an embodiment may perform the above-described technologies to perform the convergence material output, thereby outputting the 3D object. For example, the 3D printing method may output a product including hardware therein or a medical human tissue such as an artificial heart instead of outputting a simple outer shape.

A 3D printing method according to another embodiment will be described with reference to FIGS. 7 to 17.

Figure 7:
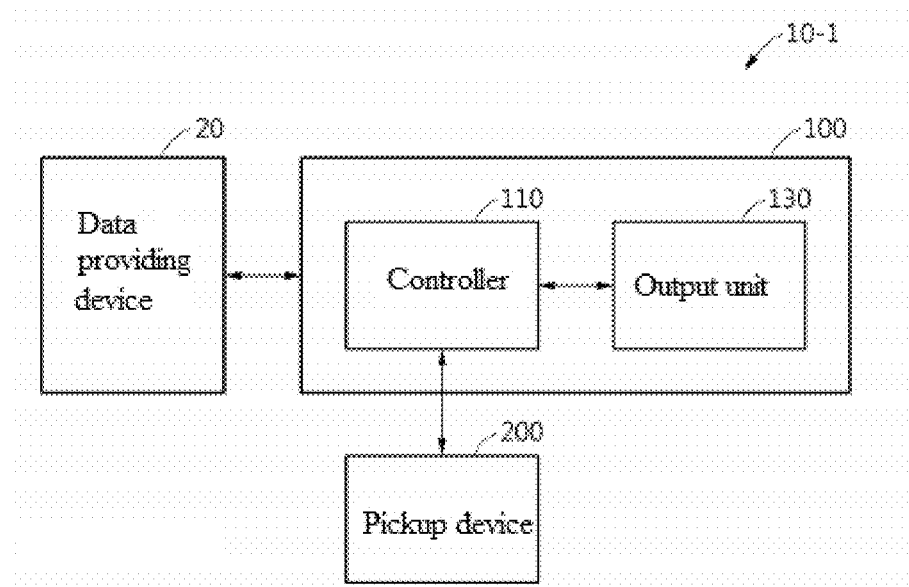
FIG. 7 is a schematic block diagram of a 3D printer system according to another embodiment.
Figure 8:
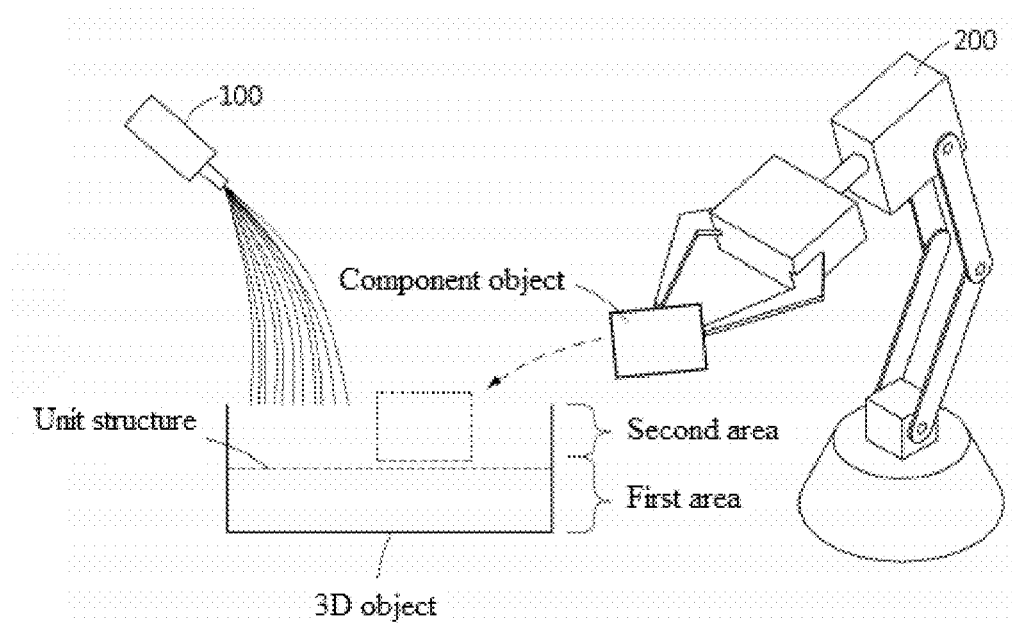
FIG. 8 is a view for explaining an operation of arranging a component object into a 3D object while forming the 3D object by a 3D printer.

FIG. 7 is a schematic block diagram of a 3D printer system according to an embodiment, and FIG. 8 is a view for explaining an operation of arranging a component object into a 3D object while forming the 3D object by a 3D printer.

Referring to FIGS. 7 and 8, a 3D printer system 10-1 may form a 3D object and a component object while selecting a single material output method, a different kinds of materials output method, and a convergence material output method. Here, the 3D printer system 10-1 may form the 3D object while mounting at least one component object into the 3D object.

The 3D printer system 10-1 includes a data providing device 20, a 3D printer 100, and a pickup device 200. The pickup device 200 may be realized as a device independent from the 3D printer 100 and connected to the 3D printer 100 to communicate with the 3D printer 100 in various methods including local or remote connection. However, the embodiment of the present invention is not limited thereto.

The pickup device 200 may be realized in the 3D printer 100 according to an embodiment. The data providing device 20 may perform the simulation methods described in FIGS. 1 to 6 and generate 3D printing data. The data providing device 20 may provide the 3D printing data to the 3D printer 100.

The 3D printer 100 may selectively perform the single material output method, the different kinds of materials output method, and the convergence material output method to repeatedly output (or laminate) layers, thereby forming (or molding) the 3D object. The convergence material output method may represent a method of mixing different materials to output the mixed materials into a convergence material. That is, the 3D printer 100 may output in various methods without material restriction. The 3D printer 100 may include a controller 110 and an output unit 130.

The controller 110 may control overall operations of the 3D printer 100. Also, the controller 110 may control operations of the pickup device 200.

The controller 110 may control the output unit 130 to form the 3D object and/or the component object configuring (or mounted to) the 3D object through various output methods.

For example, the controller 110 may control the output unit 130 to form a structure that is an outer shape design, a biological tissue such as medical teeth and bones, PCB that is an electric schematic, and an electronic component coil mounted to the PCB through the single material output method and the two kinds of materials output method.

For another example, the controller 110 may adjust a mixing ratio of two or more materials based on a characteristic property degree to differently form a resistance of an electronic component, a capacity value of a capacitor, values of buffering, hardness, or strength, and the number of functionality.

For another example, the controller 100 may control the output unit 130 to form an electronic product including a structure, PCB, and an electronic component, an artificial heart including an electronic component therein, and an artificial tissue including a sensor therein through the two kinds of materials output method and the convergence material output method.

Also, the controller 110 may form the 3D object while mounting at least one component object into the 3D object.

The controller 110 may obtain 3D modeling data of the 3D object, object information of the component object, and a connection relationship (e.g., connection data) between component objects from the 3D printing data. The component object may be an electric and/or electronic component for the 3D object. For example, the component object may represent various components such as an electric wire, a circuit, PCB, LED, a battery, and a microcomputer. The connection relationship between the component objects may include an electric schematic arrangement relationship, an electric connection relationship, and/or a communication connection relationship between the component objects. The connection relationship between the component objects may include an electric schematic arrangement relationship, an electric connection relationship, and/or a communication connection relationship between the component objects.

The controller 110 may form the 3D object through the output unit 130 based on the 3D printing data. Also, the controller 110 may control the pickup device 200 so that at least one component object is mounted into the 3D object while the 3D object is formed based on the 3D printing data.

The output unit 130 may form a plurality of areas configuring the 3D object by using at least one material. The output unit 130 may form a plurality of areas while selectively performing the single material output method, the different kinds of materials output method, and the convergence material output method Also, the output unit 130 may bond the component object at a mounted position to fix the component object in the 3D object.

The pickup device 200 may mount at least one component object in the 3D object according to control of the controller 110. Here, the pickup device 200 may mount at least one component object into the 3D object by using a coordinate system that is set with respect to a central point of the 3D object.

Figure 9:
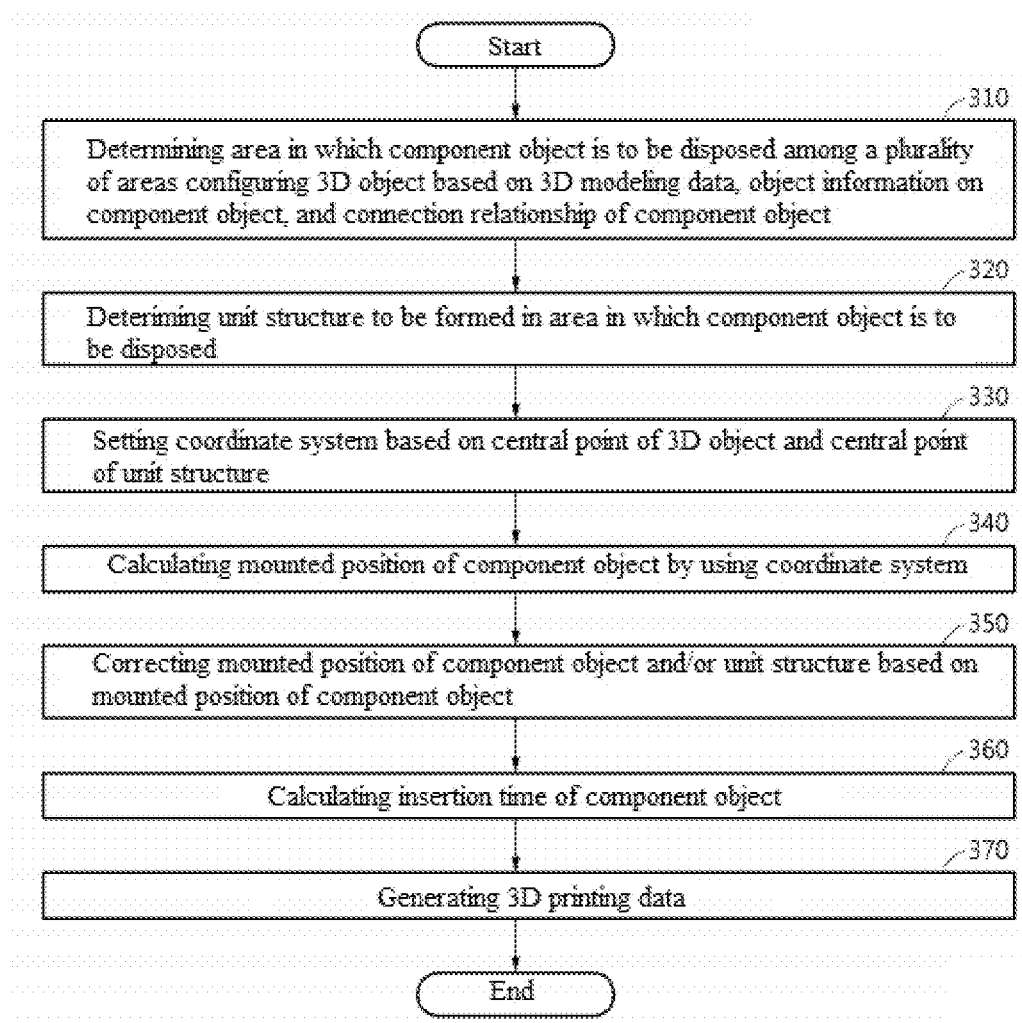
FIG. 9 is a flowchart for explaining an operation of generating 3D printing data for arranging the component object into the 3D object while forming the 3D object.
Figure 10:
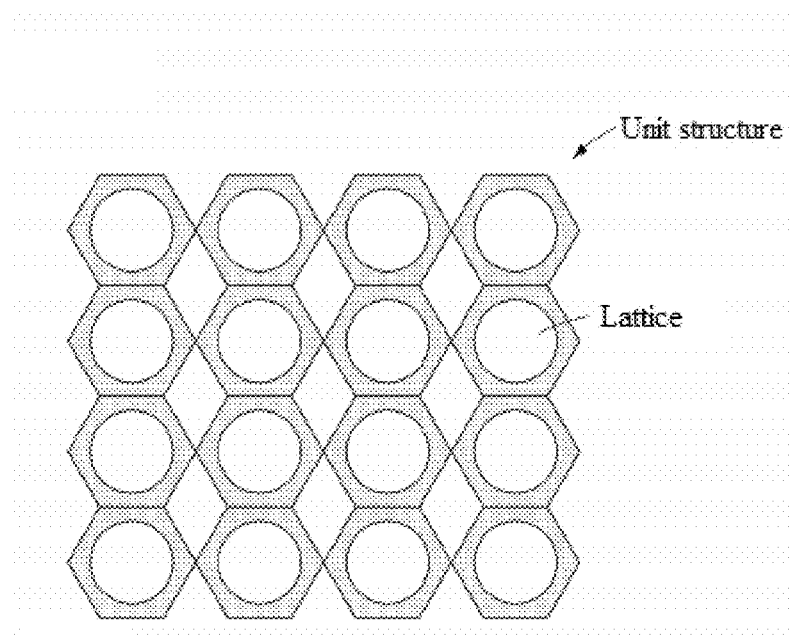
FIG. 10 is a view illustrating one example of a unit structure for arranging the component object.
Figure 11:
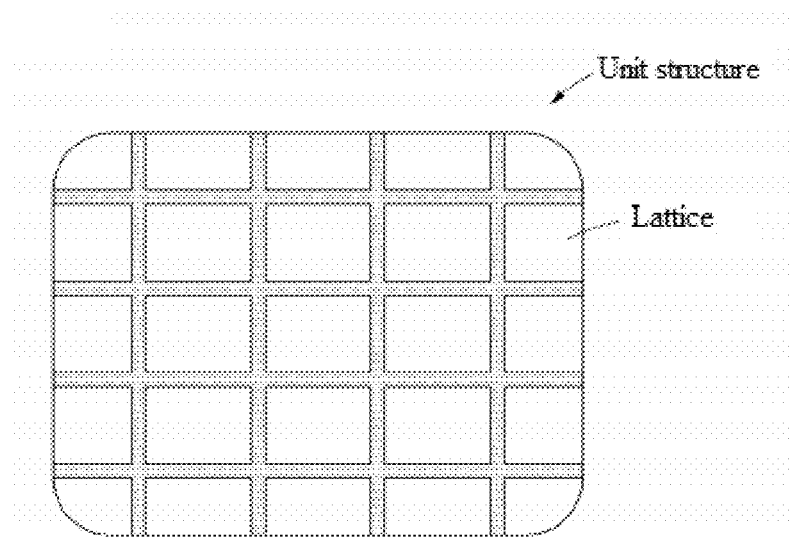
FIG. 11 is a view illustrating another example of the unit structure for arranging the component object.

FIG. 9 is a flowchart for explaining an operation of generating the 3D printing data for arranging the component object into the 3D object while forming the 3D object, FIG. 10 is a view illustrating one example of a unit structure for arranging the component object, and FIG. 11 is a view illustrating another example of the unit structure for arranging the component object.

Referring to FIGS. 9 to 11, although the controller 110 receives the 3D printing data from the data providing device 20, the controller 110 may re-generate the 3D printing data based on the 3D modeling data of the 3D object, the object information of the component object, and the connection relationship between the component objects, which are included in the 3D printing data. The controller 110 may form the 3D object while mounting at least one component object into the 3D object through the pickup device 200 and the output unit 130 based on the 3D printing data (data initially provided from the data providing device 20 or data re-generated by using the same).

A process of re-generating the 3D printing data will be described below.

Firstly, the controller 110 may determine an area in which the component object is to be disposed among a plurality of areas configuring the 3D object based on the 3D modeling data, the object information of the component object, and the connection relationship between component objects. Each of the plurality of areas may be formed by using a corresponding material. The materials corresponding to the plurality of areas, respectively, may be different kinds of materials, i.e., different.

The material for forming the area in which the component object is to be disposed may be allocated based on at least one of a material, a shape, and an electric property of the component object and a component role of the 3D object. For example, when the component object is a LED, a material of an area in which the LED is to be disposed may be allocated as a material having permeability and/or transparency so that light of the LED is outputted to the outside through the area in which the LED is disposed. That is, the material for forming the area in which the component object is to be disposed may be allocated differently from that of the component object.

The controller 110 may determine the unit structure to be formed in the area in which the component object is to be disposed. The unit structure may be formed in the 3D object to arrange the component object in the 3D object. The unit structure is intended to arrange the component objects without collision between positions of the component objects.

The unit structure may be formed in a plurality of areas at different positions. That is, the component objects may be disposed in the same unit structure, but also be disposed in the unit structures formed in different areas.

As illustrated in FIGS. 10 and 11, the unit structure may include a plurality of lattices. Since the unit structure has a lattice shape, each of the lattices may include an empty space.

The plurality of lattices may be unit lattices. For example, each of an outer diameter and an inner diameter of the unit lattice may have a polygonal shape, and the outer diameter and the inner diameter may have the same shape or different shapes. For another example, the outer diameter of the unit lattice may have a polygonal shape, and the inner diameter of the unit lattice may have a circular shape. Also, the plurality of lattices may be unit lattices having different shapes.

Here, the controller 110 may determine the unit structure based on the object information of the component object. For example, the controller 110 may determine the unit structure including the unit lattice corresponding to a size of the component object disposed in the unit structure (i.e., the lattice suitable to the size of the component object). For another example, the controller 110 may determine the unit structure including the unit lattice corresponding to a size of the component object having a minimum size among the component objects disposed in the unit structure (i.e., the lattice suitable to the size of the component object having the minimum size).

The controller 110 may set a coordinate system based on a central point of the 3D object and a central point of the unit structure. For example, the controller 110 may set the coordinate system with respect to the central point of the 3D object. Also, the controller 110 may set the coordinate system with respect to the central point of the unit structure.

The controller 110 may calculate a mounted position of the component object by using the coordinate system. That is, the unit structure is used for the coordinate system for calculating the mounted position for mounting the component object into the 3D object, and various coordinate systems may be generated according to structures of the unit structure.

The controller 110 may correct the mounted position of the component object based on the mounted position of the component object and/or correct the unit structure. A detailed description on this will be described with reference to FIGS. 12 to 14.

The controller 110 may calculate an insertion time of the component object. For example, the controller 110 may calculate the insertion time of the component object based on a formation time of the area in which the component object is to be disposed and a formation time of the unit structure among the plurality of areas. Also, the controller 110 may calculate the insertion time of the component object in further consideration of the insertion time of another component object mounted to the unit structure. The formation time may include a formation start time and a formation end time.

Through the above-described process, the 3D printing data may be re-generated. The 3D printing data may include the 3D modeling data, the object information of the component object, the area in which component object is to be disposed, information related to mounting of the component object (e.g., mounted position and mounted time), and information of the unit structure.

A process of re-generating the above-described 3D printing data may be performed in the data providing device 20.

The controller 110 may control the output unit 130 and the pickup device 200 based on the 3D printing data to perform 3D printing on the 3D object.

Figure 12:
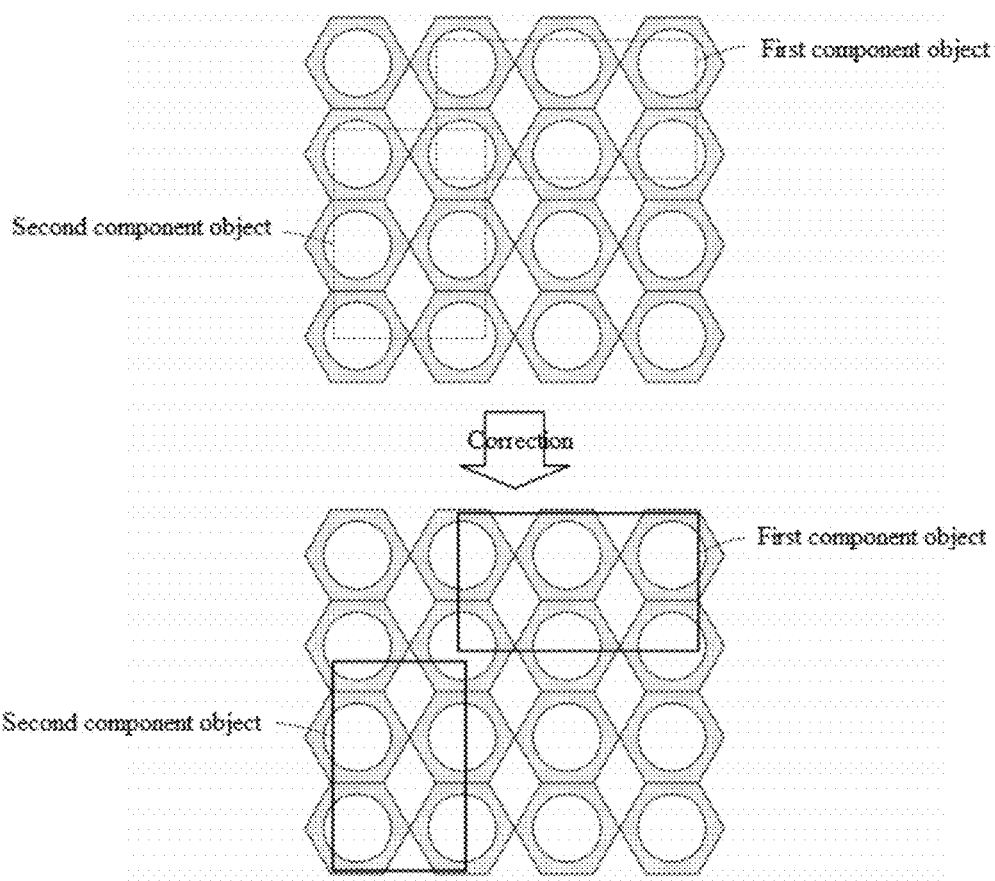
FIG. 12 is a view for explaining one example of an operation of correcting a mounted position of the component object.

FIG. 12 is a view for explaining one example of an operation of correcting the mounted position of the component object.

The controller 110 may correct the mounted position of the component object. For example, the controller 110 may determine whether the component objects overlap each other based on the mounted position of the component object and correct the mounted position of the component object according to a determination result thereof.

The controller 110 may set a vertical direction of a plane of the 3D object as a Z-axis with respect to a center of gravity of the 3D object in the coordinate system. The controller 110 may obtain a 3D coordinate of each component object disposed in the unit structure by using the coordinate system. The controller 110 may compare the 3D coordinates of the component objects to check whether the component objects overlap (or collide with) each other.

Figure 13:
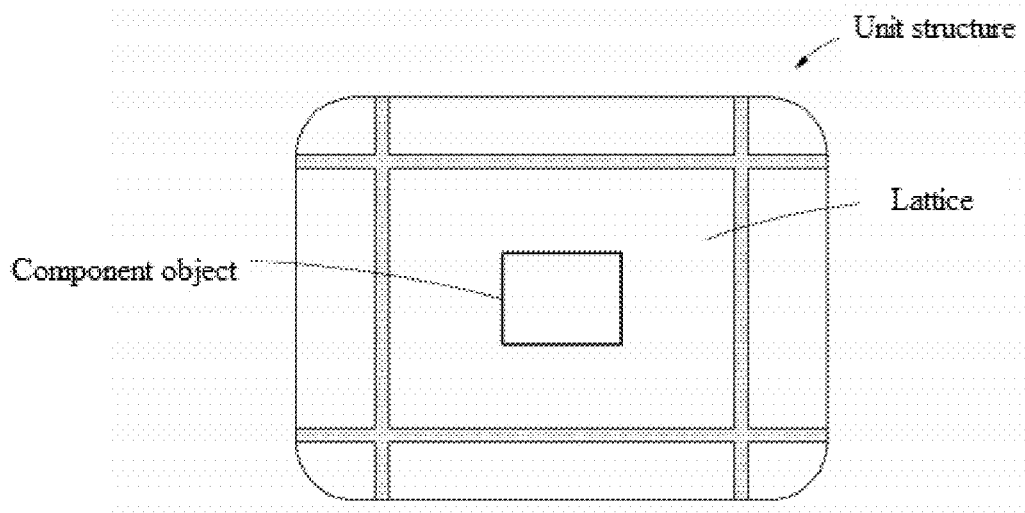
FIG. 13 is a view for explaining another example of the operation of correcting the mounted position of the component object.

FIG. 13 is a view for explaining another example of the operation of correcting the mounted position of the component object.

The controller 110 may calculate an insertion time of the component object. For example, the controller 110 may determine whether the unit structure corresponding to the mounted position of the component object is supported by the lattice based on the object information of the component object and correct the mounted position of the component object according to a determination result thereof.

The controller 110 may set the vertical direction of the plane of the 3D object as the Z-axis with respect to the center of gravity of the 3D object in the coordinate system. The controller 110 may obtain a 3D coordinate of each component object disposed in the unit structure and a 3D coordinate of each lattice configuring the unit structure by using the coordinate system. The controller 110 may compare the coordinate of each component object and the coordinate of each lattice to check whether each component object is supported by the lattice of the unit structure.

Figure 14:
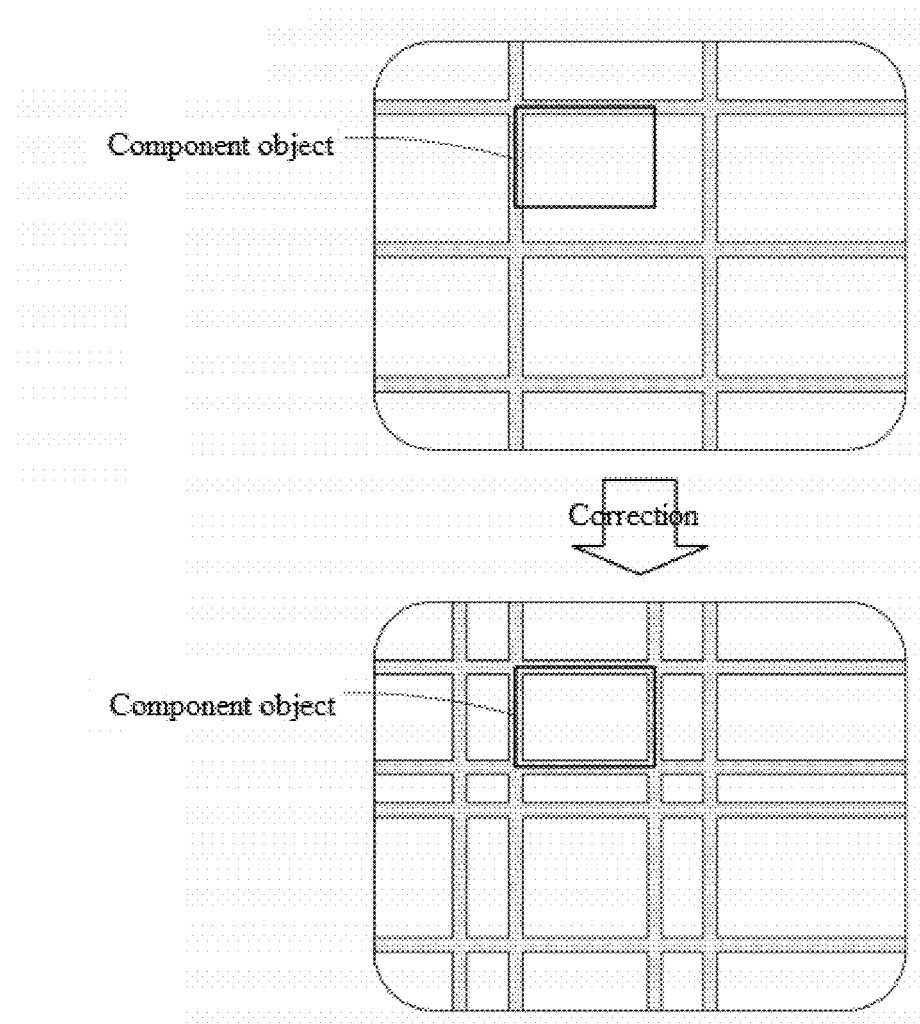
FIG. 14 is a view for explaining another example of the operation of correcting the mounted position of the component object.

FIG. 14 is a view for explaining another example of the operation of correcting the mounted position of the component object.

As illustrated in FIG. 14, when the component object is not supported by the lattice of the unit structure corresponding to the mounted position, the controller 110 may correct the unit structure.

For example, the controller 110 may obtain a coordinate of each lattice configuring the unit structure by using the coordinate system and correct only the lattice of the unit structure corresponding to the mounted position of the component object based on the obtained coordinate of each lattice.

Also, the controller 110 may correct only the lattice in which the component object is to be disposed so that the component object is inserted and fixed to the lattice in which the component object is to be disposed.

Figure 15:
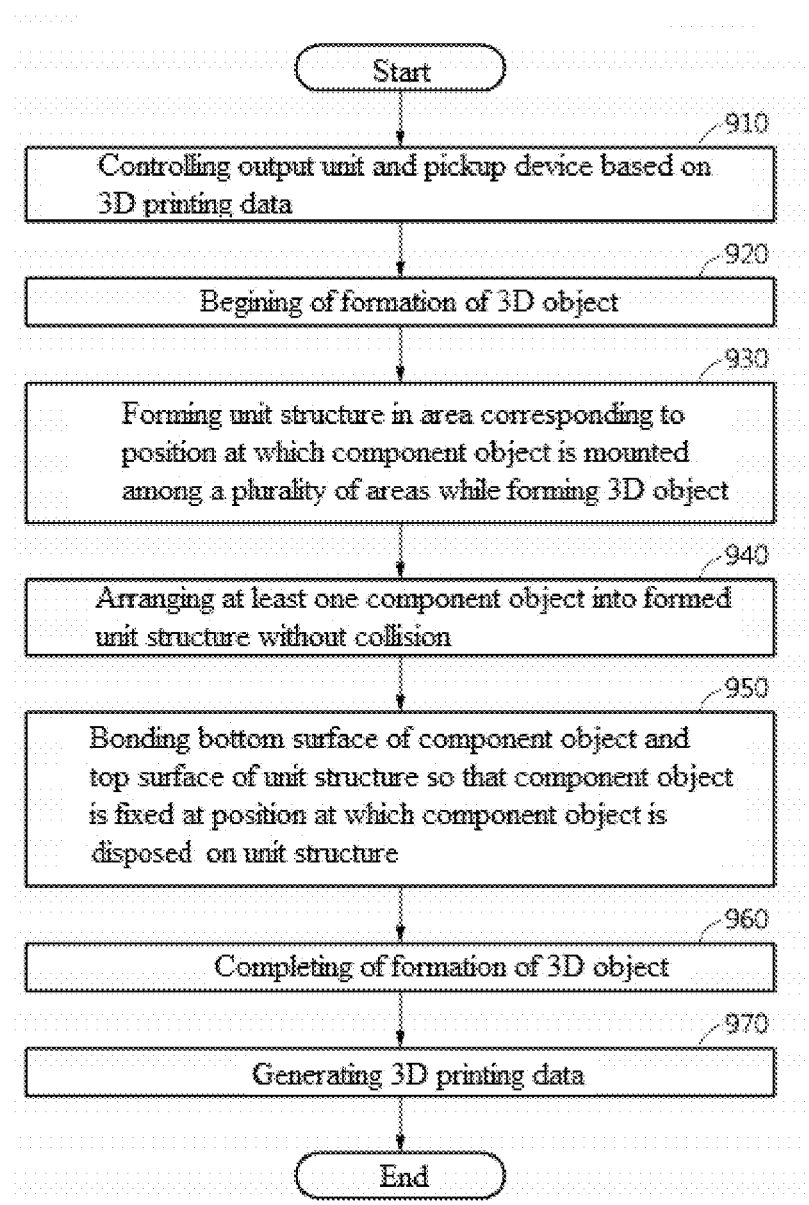
FIG. 15 is a flowchart for explaining an operation of forming the 3D object by using 3D printing data.
Figure 16:
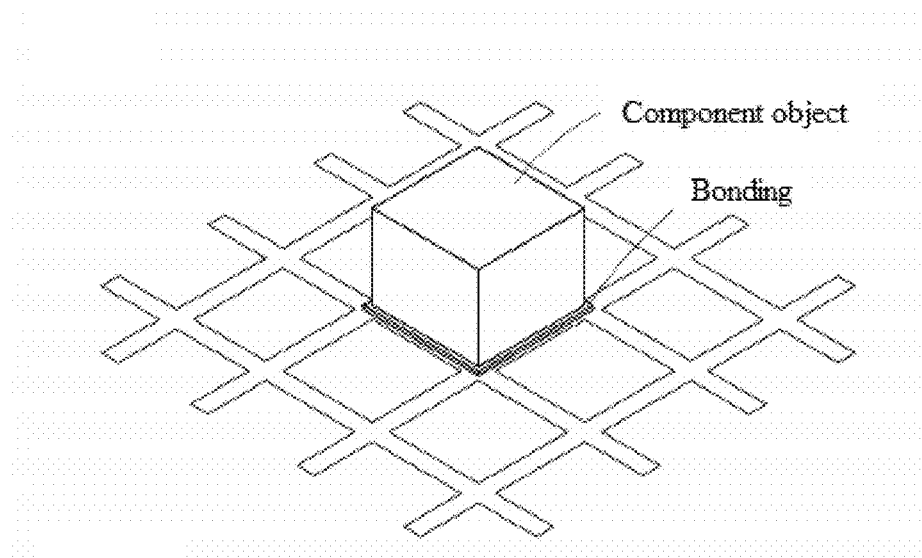
FIG. 16 is a view illustrating one example of a method for fixing the component object to the unit structure.
Figure 17:
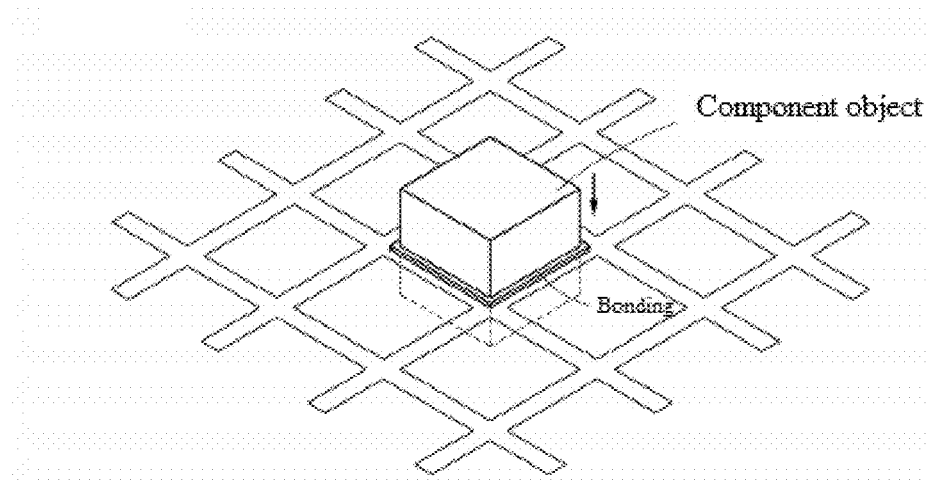
FIG. 17 is a view illustrating another example of the method for fixing the component object to the unit structure.

FIG. 15 is a flowchart for explaining an operation of forming the 3D object by using the 3D printing data, FIG. 16 is a view illustrating one example of a method of fixing the component object to the unit structure, and FIG. 17 is a view illustrating another example of the method of fixing the component object to the unit structure.

The controller 110 may control the output unit 130 and the pickup device 200 based on the 3D printing data in block 910.

The output unit 130 may begin to form the 3D object according to control of the controller 110 in block 920. The output unit 130 may form a plurality of areas configuring the 3D object in an order (e.g., from the bottom).

The output unit 130 may form the unit structure in an area corresponding to a position for mounting the component object among the plurality of areas while forming the 3D object in block 930.

The pickup device 200 may position at least one component object to the unit structure formed according to the control of the controller 110 without collision in block 940.

The output unit 130 may bond a bottom surface of the component object and a top surface of the unit structure so that the component object is fixed onto the unit structure in block 950. For example, the output unit 130 may output a bonding area along a circumference of the bottom surface of the component object so as to bond the bottom surface of the component object and the top surface of the unit structure. Also, the output unit 130 may output the bonding area along an insertion boundary so that the component object is firmly fixed even when inserted to the lattice of the unit structure.

The insertion boundary may represent a contact boundary when the component object is inserted to the lattice.

The output unit 130 may complete formation of the 3D object according to the control of the controller 110 in block 960.

When the unit structure in which the component object is to be disposed is varied in position and formed in a plurality of areas, blocks 930 to 950 may be repeatedly performed.

As described above, the embodiments may mount at least one component object into the 3D object while forming the 3D object.

Also, when the 3D object including the electric component is 3D-printed, the embodiments may select an electric component or an operation corresponding thereto in the 3D modeling to directly perform a simulation, and a product including a circuit may be 3D-printed by this simulation.

A 3D printing method according to another embodiment will be described with reference to FIGS. 18 to 23.

Since embodiments are applicable to all objects, e.g., a vehicle, a ship, a plane, and a building, which include electric wire, the scope of the embodiments is not limited. However, hereinafter, the object will be exemplarily described as a vehicle for convenience of description.

Figure 18:
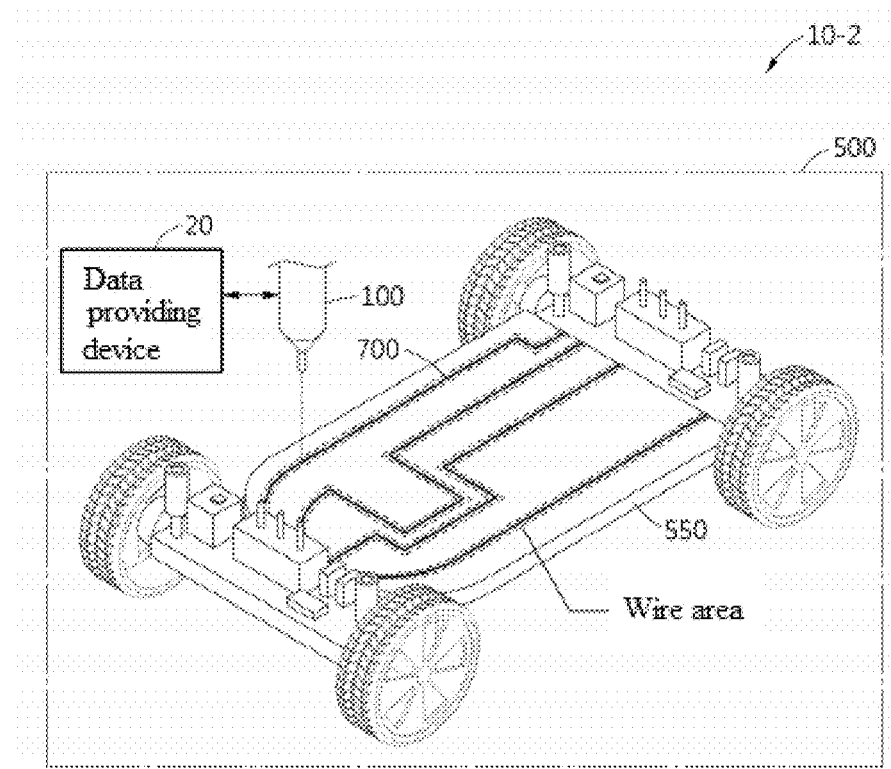
FIG. 18 is a conceptual view for explaining a 3D printing method for a vehicle according to another embodiment.

FIG. 18 is a conceptual view for explaining a 3D printing method according to an embodiment.

Referring to FIG. 18, a 3D printing system 10-2 includes a vehicle 500 and a 3D printer 100. The 3D printer 100 may be used for manufacturing the vehicle 500. For example, the vehicle 500 may be a hybrid vehicle, an electric vehicle, or a smart vehicle.

A data providing device 20 may perform the simulation methods described in FIGS. 1 to 6 and generate 3D printing data. The data providing device 20 may provide the 3D printing data to the 3D printer 100.

The 3D printer 100 may form a chassis frame 550 of the electric vehicle 500 based on the 3D printing data. For example, the chassis frame 550 may include a chassis frame for forming a lower outer shape of the electric vehicle 500, a chassis frame for forming an upper outer shape, and a chassis frame for forming a side outer shape. However, the embodiment of the present invention is not limited to the chassis frame 550. The chassis frame 550 may include all frames having various functions of the electric vehicle.

The 3D printer 100 may form a wire unit 700 to the chassis frame 550 based on the 3D printing data. The wire unit 700 may represent a wire for transmitting electricity from a power source of the vehicle 500 to a component of the vehicle 500. The component may represent an electric and/or electronic device component configuring the vehicle 500.

The 3D printer 100 may output a connection portion of the component and a wire for transmitting electricity in an integrated manner based on the 3D printing data, so as to form the wire unit 700. Thus, the 3D printer 100 may simplify a connection portion (e.g., the connection portion of the component) of the vehicle 500 and provide a safety function to the chassis frame 550.

The 3D printer 100 may form the wire unit 700 by using convergence multi-materials. The convergence multi-materials may include a carbon material (or carbon fiber material), a conductive material, and a non-conductive material. The wire unit 700 may be divided into a conductive material and a non-conductive material to self-check an output (e.g., an electric output) of a conductor area.

One or more wire units 700 may be formed to transmit electricity to the component of the chassis frame 550. The wire unit 700 may be used to provide a brake function when safety of power supply of the vehicle 500 and electricity supply are broken.

Figure 19:
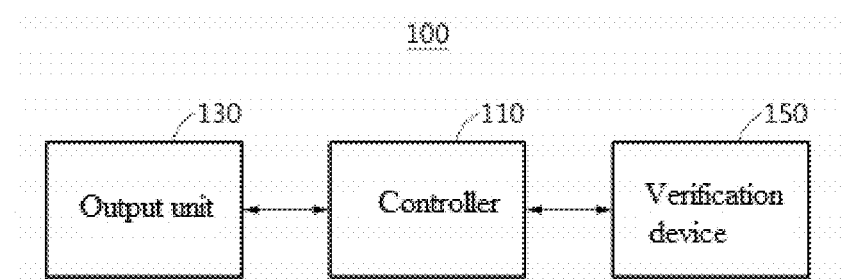
FIG. 19 is a schematic block diagram of a 3D printer in FIG. 18.
Figure 20:
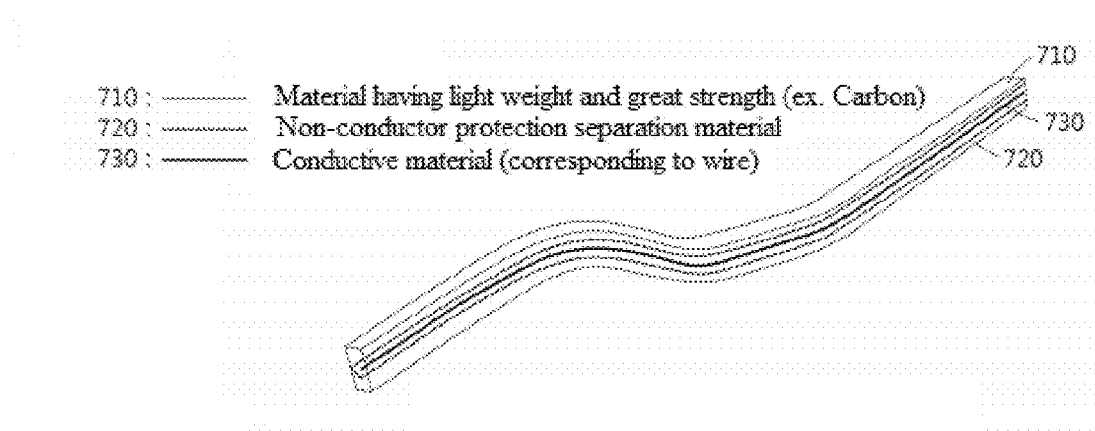
FIG. 20 is a conceptual view for explaining a wire unit formed in FIG. 18.

FIG. 19 is a schematic block diagram of the 3D printer in FIG. 18, and FIG. 20 is a conceptual view for explaining the wire unit formed in FIG. 19.

Referring to FIGS. 19 and 20, the 3D printer 100 may repeatedly output (or laminate) layers based on the 3D printing data to form (or mold) the vehicle 500. The 3D printer 100 may include a controller 110 and an output unit 130. The 3D printer 100 may further include a verification device 150.

The verification device 150 may scan the chassis frame 550 of the vehicle 500 to generate a scan image of the chassis frame 550. The verification device 150 may transmit the scan image of the chassis frame 550 to the controller 110.

The verification device 150 may perform a scan operation by using optics, an ultrasonic wave, and a laser. Although the verification device 150 is realized in the 3D printer 100 in FIG. 19, the embodiment of the present invention is not limited thereto. For example, the verification device 150 may be realized as a device independent from the 3D printer 100 and connected with the 3D printer 100 to communicate with the 3D printer 100 in various manners including a local or remote connection.

The controller 110 may control overall operation of the 3D printer 100. For example, the controller 110 may control operations of the output unit 130. Also, the controller 110 may control operations of the verification device 150.

The controller 110 may determined a wire area in the chassis frame 550 based on the scan image of the chassis frame 550 and an installation position of the component of the vehicle 500. For example, the wire area may represent an area corresponding to a path, at which the wire unit 700 is formed, in the chassis frame 550.

The wire area may be determined so that the power source of the vehicle 500 is connected with a minimum distance to each component. For example, the power source may be a battery providing electricity to the vehicle 500.

The output unit 130 may form the vehicle 500 according to control of the controller 110. The output unit 130 may form the chassis frame 550 and form the wire unit 700 in the chassis frame 550.

The output unit 130 may form the wire unit 700 by using a plurality of materials. The wire unit 700 may include an outer part 710, a protection separation part 720, and a wire 730. The outer part 710 may be coupled to an area, which corresponds to the wire area, of the chassis frame 550. The protection separation part 720 may protect the wire 730 through which electricity flows from the area, which corresponds to the wire area, of the chassis frame 550. The wire 730 may transmit electricity from the power source of the vehicle 500 to a component connected thereto.

The outer part 710 may surround the protection separation part 720, and the protection separation part 720 may surround the wire 730. For example, the output unit 130 may output a material for forming the outer part 710 on the wire area, then output a material for forming the protection separation part 720, and then output the wire 730, so that the outer part 710 surrounds the protection separation part 720, and the protection separation part 720 surrounds the wire 730. Also, the output unit 130 may sequentially output materials for forming the protection separation part 720 and the outer part 710 again at the end, so that the outer part 710 surrounds the protection separation part 720, and the protection separation part 720 completely surrounds the wire 730.

The wire unit 700 may further include a first connection part 750 and a second connection part 770. The first connection part 750 may be a connector formed at one side of the wire unit 700 and connected to the power source of the vehicle 500. The second connection part 770 may be a connector formed at the other side of the wire unit 700 and connected to the component. That is, the first connection part 750 and the second connection part 770 may be simultaneously outputted to the wire unit 700 in an integrated manner.

As one wire unit 700 is formed such that a portion to be connected to the vehicle 500 (e.g., a portion to be connected to the component and/or a portion to be connected to the power source) and a wire for transmitting electricity are outputted in an integrated manner, a connection portion connected with the wire unit 700 may be simply processed, and the wire unit 700 may have rigidity.

The outer part 710 may be made of a first material, the protection separation part 720 may be made of a second material, and the wire 730 may be made of a third material. The first material may be a material having a light weight and a great strength so as to be coupled to the chassis frame 550. The first material may be a carbon material (or a carbon fiber material). The second material may be a non-conductor material for protecting a conductive wire. The third material may be a conductive material for a wire function.

Figure 21:
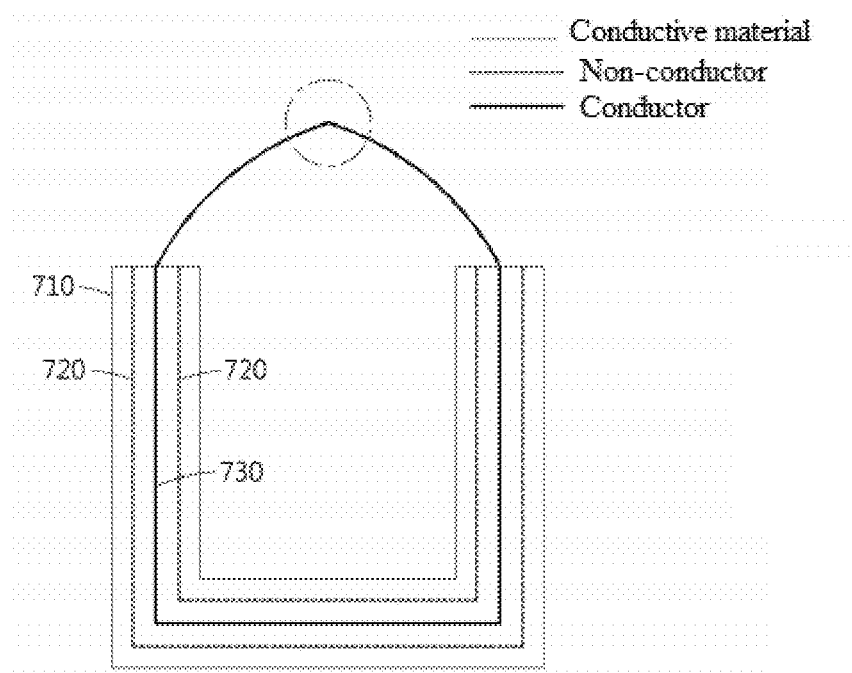
FIG. 21 is a view for explaining an example in which the wire unit of FIG. 20 is used in a vehicle.

FIG. 21 is a view for explaining an example in which the wire unit of FIG. 20 is used in a vehicle.

The wire unit 700 may be divided into a conductive material and a non-conductive material to self-check an output (e.g., an electric output) of a conductor area.

The wire unit 700 may be used to self-check an electricity output problem. A user may connect a device capable of checking an electricity output to both end wires of the wire unit 700 and check whether the wire 730 of the wire unit 700 is defected through the electricity output checking.

Here, the device capable of checking the electricity output may measure a resistance value and/or a degree of an electric charge quantity output and determine whether a short-circuit occurs.

The wire unit 700 may be used for a function of self-checking an output quality through internal output degree measurement and a function of determining whether a defect occurs. The output quality checking of the wire unit 700 may be used for a quality inspection, an intermediate inspection during usage, and a safety inspection of the vehicle 500.

Figure 22:
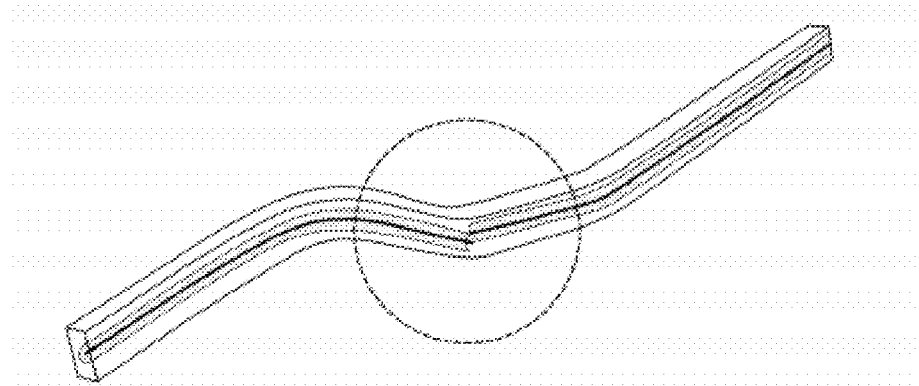
FIGS. 22 and 23 are views for explaining another example in which the wire unit of FIG. 20 is used in a vehicle.
Figure 23:
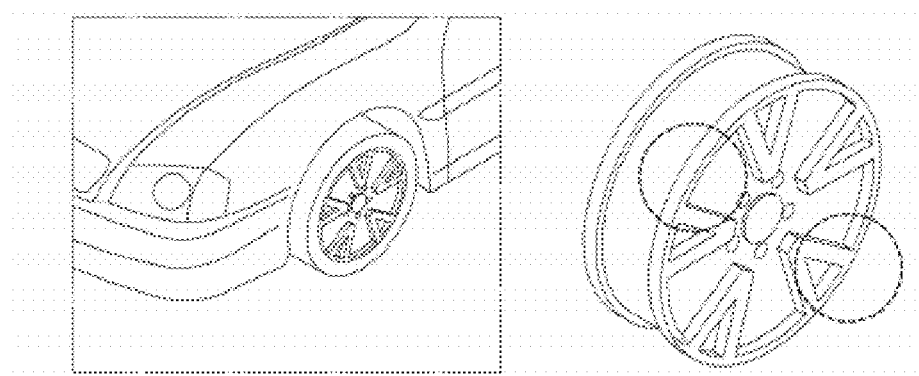

FIGS. 22 and 23 are views for explaining another example in which the wire unit of FIG. 20 is used in a vehicle.

The wire unit 700 may be used to provide a brake function when safety of power supply of the vehicle 500 and electricity supply are broken. The wire unit 700 may be used for a brake system of a vehicle. The brake system of the vehicle 500 may apply a brake function to a rotation wheel or a gear box in addition to a typical brake system including a brake pedal, a brake pad, and a brake device (e.g., a frame lock, etc.).

The wire unit 700 may be formed between a power source unit and a driving unit (e.g., a driving motor, an electric motor, etc.) of the vehicle 500. A detection device (not shown) may detect a current, a voltage, and/or a power flowing through the wire unit 700 formed between the power source unit and the driving unit to detect breakage of electricity supply. The detection device may also detect breakage of electricity supply to main electric components connected with the driving unit.

Also, the detection device may include a circuit driven only in case of a reverse current. As a device driven only in case of the reverse current is realized even in the brake system of the vehicle 500, the brake function driven only in case of the reverse current may be performed. A brake safety device driven in case of the reverse current such as a short-circuit instead of breakage may be a device including two negative (−) wires and driven when one wire becomes positive (+) in case of a short-circuit.

When an electric control problem such as battery discharge and fire and electricity blockage occur during driving, the detection device may detect this, and the brake system of the vehicle 500 may operate in response thereto.

The brake system may perform a forced brake function by using a physical or restoration property.

The break method using the physical property may include a method of using a deformation caused by a current short-circuit such as a fuse short-circuit. When a rotation device, a frame close to rotation, or a connection portion is broken like a fuse because a short-circuit occurs as a high current flows in a state in which electricity flows therethrough, a physical restoration designed such that a broken portion is be bent in a specific direction is implemented to drive the brake.

The brake device may be realized by a brake pad and/or a frame lock, and the brake pad may contact a wheel frame and/or a shaft to stop rotation. The gear or pin type frame lock may be inserted or coupled to the rotation shaft. A temporary electric accumulator or capacitor (regulator) for the break may be provided to the detection device to drive a device for allowing the brake device to physically contact the wheel frame and/or the rotation shaft.

The break method using the restoration property uses a shape memory alloy to apply a specific current or heat when electrically driven, thereby maintaining a shape for driving instead of breaking, and then the shape is restored to a break shape when electricity is broken, and the specific current or heat is not applied. As a feature of using an electric property is the most safe, a restoration type when electricity is not applied may be the most appropriate.

The shape memory alloy or a material or function having a similar restoration property may be used to maintain a driving shape when electricity flows through the rotation device, the frame close to rotation, or the connection portion and a non-driving shape that is the break shape when electricity does not flow therethrough.

Also, an electric fuse provided on a wheel may be used to realize the break method. The break method may be realized by using the shape memory alloy maintaining the shape when electricity flows and restored to the shape capable of breaking when electricity does not flow. The corresponding function may be individually applied to even the wheel to apply the brake function according to electricity supply, and when the electricity supply is specially applied, the wheel itself may be independently driven instead of the typical vehicle frame.

The method according to an embodiment may be realized as a program command type that is executable through various computer units and recorded in computer readable media. The computer readable media may include one of or a combination of a program command, a data file, and a data structure. The program command recorded in the media may be specifically designed and configured for the embodiment or well-known technology to a person skilled in the field of computer software. For example, the computer readable media may include: magnetic media such as a hard disk, a floppy disk, and a magnetic tape; optical media such as CD-ROM and DVD; magneto-optical media such as a floptical disk; and a hardware device particularly configured to store and execute a program command, e.g., ROM, RAM, and a flash memory. For example, the program command includes a machine language code produced by a compiler and a high-level language code that is executable by using an interpreter or the like. The hardware device may be configured to operate as at least one software module for performing operations of the embodiment, and the opposite will be true.

The software may include a computer program, a code, an instruction, or a combination thereof, and configure a process device to operate in a desired manner or independently or collectively command the process device. The software and/or the data may be embodied permanently or temporarily to a certain-type machine, a component, a physical device, virtual equipment, computer storage media or device, or a transmitted signal wave in order to provide command or data to the process device or be analyzed by the process device. The software may be distributed on the computer system connected by network and stored or executed by the distributed method. The software and the data may be stored in at least one computer readable record media.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the above-described technologies may be performed in a different order, the components such as a system, a structure, a device, and a circuit may be coupled or combined in a different method from the above-described method, and the components may be replaced by equivalents.

Therefore, the detailed description of the present invention does not intend to limit the present invention to the disclosed embodiments. Further, the appended claims should be appreciated as a method including even another embodiment.

What is claimed:

1. A 3D printing output method performed by a machine, the method comprising:
    generating, by the machine, material data for at least one material to be used for printing a 3D object, the material data being based, at least in part, on a material characteristic requirement, wherein the material characteristic requirement is based, at least in part, on one of electric characteristic or mechanical characteristic of the at least one material;
    designing, by the machine, the 3D object based, at least in part on the material data, wherein designing the 3D object comprises designing a 3D outer shape based on 3D modeling data of the 3D object, obtaining component data of a component object and connection data of a connection relationship between the component objects by analyzing an electric schematic through a 3D schematic convert method, arranging the component objects into the 3D outer shape on the basis of the component data, and designing a connection part between the component objects disposed in the 3D outer shape on the basis of the connection data;
    performing, by the machine, a simulation on the 3D object designed on the basis of the material data; and
    generating, by the machine, the 3D printing data for performing 3D printing on the 3D object on the basis of an evaluation criterion and a result of the simulation.

2. The 3D printing output method of claim 1, wherein generating the material data comprises at least one of performing a material simulation for determining one kind of material or different kinds of materials, and performing a material convergence simulation for determining a convergence material.

3. The 3D printing output method of claim 2, wherein performing the material simulation comprises performing a simulation on a plurality of materials included in a material list on the basis of the material characteristic requirement, and selecting at least one material among the plurality of materials on the basis of a result of the simulation.

4. The 3D printing output method of claim 2, wherein performing the material convergence simulation comprises performing a simulation on a plurality of convergence materials included in a convergence material list on the basis of a convergence method and convergence material basic data, and selecting at least one convergence material among the plurality of convergence materials on the basis of a result of the simulation.

5. The 3D printing output method of claim 4, wherein performing the simulation on the plurality of convergence materials comprises estimating a suitable convergence ratio of the plurality of convergence materials, and checking information on material characteristics of the convergence materials that are converged according to the suitable convergence ratio estimated for each convergence material.

6. The 3D printing output method of claim 1, wherein designing the 3D object further comprises allocating a material to each area of the 3D object on the basis of the material data.

7. The 3D printing output method of claim 6, wherein allocating comprises filling a space in the 3D outer shape except for the component object and the connection part with a specific material.

8. The 3D printing output method of claim 1, wherein performing the simulation comprises performing a simulation on an electric characteristic of the designed 3D object, performing a simulation on a physical characteristic of the designed 3D object, and performing a simulation on a bio-characteristic of the designed 3D object.

9. The 3D printing output method of claim 8, wherein performing the simulation further comprises calculating an optimized output path for performing 3D printing on the designed 3D object.

10. The 3D printing output method of claim 1, wherein generating the 3D printing data comprises feeding-back a report of the simulation when the result of the simulation is not satisfied with the evaluation criterion or generating the 3D printing data on the basis of the report of the simulation when the result of the simulation satisfies the evaluation criterion.

* * * * *